United States Patent [19]
Lee et al.

[11] Patent Number: 5,614,855
[45] Date of Patent: Mar. 25, 1997

[54] DELAY-LOCKED LOOP

[75] Inventors: Thomas H. Lee, Cupertino; Kevin S. Donnelly, San Francisco; Tsyr-Chyang Ho, San Jose; Mark G. Johnson, Los Altos, all of Calif.

[73] Assignee: Rambus, Inc., Mountain View, Calif.

[21] Appl. No.: 512,597

[22] Filed: Aug. 21, 1995

Related U.S. Application Data

[63] Continuation of Ser. No. 196,583, Feb. 15, 1994, abandoned.
[51] Int. Cl.$^6$ ............................. H03K 5/13; H03L 7/00
[52] U.S. Cl. ........................ 327/158; 327/276; 327/156; 327/244; 327/175; 327/233; 331/17
[58] Field of Search ........................... 327/141, 144, 327/145–150, 152, 153, 154–159, 161, 162, 231, 233, 234, 235, 236, 243, 244, 250, 175, 176, 276; 331/17

[56] References Cited

U.S. PATENT DOCUMENTS

| | | | |
|---|---|---|---|
| 3,296,517 | 1/1967 | Routh et al. | 321/1 |
| 3,546,604 | 12/1970 | White | 328/155 |
| 3,555,458 | 1/1971 | Fombonne | 332/44 |

(List continued on next page.)

FOREIGN PATENT DOCUMENTS

| | | |
|---|---|---|
| 0054323A3 | 11/1981 | European Pat. Off. . |
| 61228720 | 4/1985 | European Pat. Off. . |
| 343889A3 | 5/1989 | European Pat. Off. . |
| 900113503 | 4/1990 | European Pat. Off. . |
| 0398751A2 | 5/1990 | European Pat. Off. . |
| 0407591 | 1/1991 | European Pat. Off. . |
| 0521215A1 | 10/1991 | European Pat. Off. . |
| 0490690A1 | 12/1991 | European Pat. Off. . |
| 3816973A1 | 5/1988 | Germany . |
| 4018615A1 | 11/1990 | Germany . |
| 2140993 | 5/1984 | United Kingdom . |

OTHER PUBLICATIONS

Jeff Barrow, et al., "Eliminate Oscillator From A Loop," *Electronic Design*, Apr. 27, 1989, pp. 107–108.

(List continued on next page.)

*Primary Examiner*—Timothy P. Callahan
*Assistant Examiner*—Eunja Shin
*Attorney, Agent, or Firm*—Blakely, Sokoloff, Taylor & Zafman LLP

[57] ABSTRACT

A delay locked loop (DLL) is described in which a phase detector compares the phase of the output of the DLL with that of a reference input. The output of the phase comparator drives a differential charge pump which functions to integrate the phase comparator output signal over time. The charge pump output controls a phase shifter with unlimited range that adjusts the phase of the DLL output so that the output of the phase comparator is high 50% of the time on average. Because the DLL adjusts the phase shifter until the output of the phase detector is high 50% of the time, on average, the relationship of the DLL output clock to the input reference clock depends only on the type of phase detector used. For example, when a data receiver is used as the phase detector in the DLL, the output of the DLL is a clock signal which can be used as a sampling clock for data receivers elsewhere in the system, and is timed to sample data at the optional instant independent of temperature, supply voltage and process variations. Alternatively, a quadrature phase detector may be employed to generate a clock signal that possesses a quadrature (90°) relationship with a reference clock signal input. This may be used, for example, to generate a transmit clock for a data transmission device. Furthermore, the DLL is controlled to minimize dither jitter while minimizing acquisition time. In addition, duty cycle correcting amplifiers are employed to produce a DLL output clock that has a desired duty cycle, for example 50%. Additionally, the inputs to the charge pump are reversed in alternate quadrants of the phase plane in order to enable unlimited phase shift with a finite control voltage range.

3 Claims, 13 Drawing Sheets

U.S. PATENT DOCUMENTS

| | | | |
|---|---|---|---|
| 3,617,855 | 11/1971 | Hisatsu | 327/7 |
| 3,675,139 | 7/1972 | Guest | 329/104 |
| 3,771,063 | 11/1973 | Barrett | 327/7 |
| 3,825,768 | 7/1974 | Grygera | 361/76 |
| 3,863,080 | 1/1975 | Steckler | 327/9 |
| 3,911,368 | 10/1975 | Tarczy-Hornoch | 327/237 |
| 3,965,433 | 6/1976 | Yeh | 327/234 |
| 3,982,190 | 9/1976 | Schaefer | 327/2 |
| 3,997,772 | 12/1976 | Crochiere et al. | 235/152 |
| 4,021,742 | 5/1977 | Machida | 329/50 |
| 4,110,641 | 8/1978 | Payne | 327/67 |
| 4,151,463 | 4/1979 | Kibler | 324/82 |
| 4,156,851 | 5/1979 | Winters | 327/235 |
| 4,178,554 | 12/1979 | Sase et al. | 327/3 |
| 4,249,095 | 2/1981 | Hsu | 327/53 |
| 4,283,682 | 8/1981 | Sifford et al. | 329/50 |
| 4,285,006 | 8/1981 | Kurahashi et al. | 358/35 |
| 4,291,274 | 9/1981 | Suzuki et al. | 327/12 |
| 4,364,082 | 12/1982 | Tonomura et al. | 358/28 |
| 4,373,204 | 2/1983 | Brooks | 375/120 |
| 4,383,216 | 5/1983 | Dorler et al. | 323/282 |
| 4,394,587 | 7/1983 | McKenzie et al. | 327/66 |
| 4,468,689 | 8/1984 | Nagashima | 358/31 |
| 4,473,762 | 10/1984 | Iwahashi et al. | 327/262 |
| 4,494,021 | 1/1985 | Bell et al. | 327/262 |
| 4,506,175 | 3/1985 | Reitmeier et al. | 327/12 |
| 4,520,321 | 5/1985 | Nakatsugawa et al. | 331/25 |
| 4,547,685 | 10/1985 | Wong | 327/54 |
| 4,573,022 | 2/1986 | Koga | 330/307 |
| 4,607,229 | 8/1986 | Isobe et al. | 327/256 |
| 4,623,805 | 11/1986 | Flora et al. | 327/152 |
| 4,635,097 | 1/1987 | Tatami | 358/13 |
| 4,638,190 | 1/1987 | Hwang et al. | 327/237 |
| 4,641,048 | 2/1987 | Pollock | 327/262 |
| 4,644,196 | 2/1987 | Flannagan | 327/53 |
| 4,691,125 | 9/1987 | Ledzius et al. | 327/292 |
| 4,719,365 | 1/1988 | Misono | 327/154 |
| 4,721,904 | 1/1988 | Ozaki et al. | 324/83 R |
| 4,724,337 | 2/1988 | Maeda et al. | 327/538 |
| 4,739,194 | 4/1988 | Glasby et al. | 326/126 |
| 4,739,279 | 4/1988 | Pion | 327/237 |
| 4,746,819 | 5/1988 | Kashiwagi | 327/244 |
| 4,751,469 | 6/1988 | Nakagawa et al. | 327/7 |
| 4,785,206 | 11/1988 | Hoshi | 327/56 |
| 4,789,799 | 12/1988 | Taylor et al. | 327/309 |
| 4,806,888 | 2/1989 | Salvage et al. | 333/138 |
| 4,813,005 | 3/1989 | Redig et al. | 364/580 |
| 4,814,648 | 3/1989 | Hynecek | 327/563 |
| 4,815,113 | 3/1989 | Ludwig et al. | 377/39 |
| 4,818,901 | 4/1989 | Young et al. | 326/27 |
| 4,845,675 | 7/1989 | Krenik et al. | 365/203 |
| 4,866,397 | 9/1989 | Kimyacioglu | 330/252 |
| 4,868,512 | 9/1989 | Bridgman | 327/12 |
| 4,870,303 | 9/1989 | McGinn | 327/2 |
| 4,893,094 | 1/1990 | Herold et al. | 331/1 A |
| 4,904,948 | 2/1990 | Asami | 327/12 |
| 4,924,117 | 5/1990 | Tamaru | 326/54 |
| 4,929,916 | 5/1990 | Fukuda | 331/1 A |
| 4,931,675 | 6/1990 | Iwata | 327/55 |
| 4,935,701 | 6/1990 | Kawai et al. | 327/246 |
| 4,937,476 | 6/1990 | Bazes | 327/541 |
| 4,958,133 | 9/1990 | Bazes | 330/253 |
| 4,963,817 | 10/1990 | Kohiyama et al. | 324/76.82 |
| 4,973,864 | 11/1990 | Nogami | 327/55 |
| 4,992,757 | 2/1991 | Shin'e | 330/254 |
| 4,994,773 | 2/1991 | Chen et al. | 333/164 |
| 5,015,872 | 5/1991 | Rein | 327/231 |
| 5,057,788 | 10/1991 | Ushida et al. | 330/261 |
| 5,077,489 | 12/1991 | Gola et al. | 327/77 |
| 5,079,519 | 1/1992 | Ashby et al. | 331/1 A |
| 5,095,233 | 3/1992 | Ashby et al. | 327/149 |
| 5,120,954 | 6/1992 | Taniguchi | 250/231.16 |
| 5,121,010 | 6/1992 | Hoshizaki et al. | 327/3 |
| 5,123,020 | 6/1992 | Yoshimura et al. | 371/68.1 |
| 5,126,693 | 6/1992 | Gulliver et al. | 331/25 |
| 5,126,854 | 6/1992 | Sano | 358/342 |
| 5,128,554 | 7/1992 | Hoshizaki | 327/147 |
| 5,132,567 | 7/1992 | Purl et al. | 326/110 |
| 5,132,640 | 7/1992 | Tanaka et al. | 330/252 |
| 5,148,113 | 9/1992 | Wight et al. | 327/3 |
| 5,157,276 | 10/1992 | Metz | 327/144 |
| 5,164,838 | 11/1992 | Okuda | 358/326 |
| 5,175,879 | 12/1992 | Ellingson et al. | 455/126 |
| 5,179,303 | 1/1993 | Searles et al. | 327/277 |
| 5,182,476 | 1/1993 | Hanna et al. | 327/362 |
| 5,187,448 | 2/1993 | Brooks et al. | 330/258 |
| 5,220,294 | 6/1993 | Ichikawa | 331/17 |
| 5,223,753 | 6/1993 | Lee et al. | 327/65 |
| 5,223,755 | 6/1993 | Richley | 327/276 |
| 5,248,946 | 9/1993 | Murakami | 330/253 |
| 5,253,042 | 10/1993 | Yasuda | 358/19 |
| 5,253,187 | 10/1993 | Kaneko et al. | 364/560 |
| 5,281,865 | 1/1994 | Yamashita et al. | 327/208 |
| 5,289,054 | 2/1994 | Lucas | 327/63 |
| 5,309,047 | 5/1994 | Tiede et al. | 327/52 |
| 5,309,162 | 5/1994 | Uematsu et al. | 342/372 |
| 5,317,288 | 5/1994 | Yung et al. | 332/144 |
| 5,334,953 | 8/1994 | Mijuskovic | 331/17 |
| 5,351,000 | 9/1994 | Farwell | 324/76.77 |
| 5,362,995 | 11/1994 | Kubo | 327/65 |
| 5,394,024 | 2/1995 | Buckenmaier et al. | 327/160 |
| 5,400,085 | 3/1995 | Fujiwara et al. | 348/624 |
| 5,410,263 | 4/1995 | Waizman | 327/141 |
| 5,422,529 | 6/1995 | Lee | 327/536 |
| 5,422,918 | 6/1995 | Vartti et al. | 375/371 |
| 5,432,480 | 7/1995 | Popescu | 331/11 |
| 5,440,274 | 8/1995 | Bayer | 331/1 A |
| 5,448,200 | 9/1995 | Fernandez et al. | 327/560 |
| 5,488,321 | 1/1996 | Johnson | 327/66 |

OTHER PUBLICATIONS

Jeff Sonntag and Robert Leonowich, "High Speed Communication ICs," 1990 *IEEE International Solid–State Circuits Conference Digest of Technical Papers*, Feb. 14–16, 1990, pp. 194–195 & 294.

S. Kharsheed Enam and Asad A. Abidi, "NMOS IC's for Clock and Data Regeneration in Gigabit–per–Second Optical–Fiber Receivers," *IEEE Journal of Solid–State Circuits*, Dec. 27, 1992, No. 12, New York, pp. 1763–1774.

Lance A. Glasser and Daniel W. Dobberpuhl, *"The Design and Analysis of VLSI Circuits,"* 1985, pp. 306–307.

Hiroshi Miyamoto, et al., "Improved Address Buffers, TTL Input Current Reduction and Hidden Refresh Test Mode in a 4–MB DRAM," *IEEE Journal of Solid–State Circuits*, vol. 25, No. 2, Apr. 1990, pp. 525–530.

Yiu–Fai Chan, "A–4K CMOS Prom", *IEEE Journal of Solid–State Circuits*, vol. SC–13, Oct. 1978, pp. 677–680.

H. L. Kalter, et al., "A 50–ns 16–Mb DRAM with a 10–ns Data Rate and On–Chip ECC", IEEE JSSC, vol. 25, No. 5, Oct. 1990, pp. 1118–1127.

J. Petrovick Jr., et al., "A 300k–Circuit ASIC Logic Family", IEEE JSSC, Feb. 1990, pp. 88–89.

T. Wada, et al., "Simple Noise Model and Low–Noise Data–Output Buffer for Ultrahigh–Speed Memories" IEEE JSSC, vol. 25, No. 6, Dec. 1990, pp. 1586–1588.

R. Senthinathan et al., "Simultaneous Switching Ground Noise Calculations for Packaged CMOS Devices" IEEE JSSC, vol. 26, No. 11, Nov. 1991, pp. 1724–1728.

D. Knee, "Programmable Output Pads to Solve System Timing and EMI Problems", Mar. 12, 1992, pp. 1–9.

C. Kilmer, "Process–Independent Delay Driver" IBM Technical Disclosure Bulletin, vol. 23, No. 9, Feb. 1981, pp. 4187–4188.

Patent Abstracts of Japan, vol.. 4, No. 67 (E–11) (549) May 20, 1980 & Japan, Applications, 55 035 516 (Tokyo Shibaura Denki K.K.) Mar. 12, 1980.

D.T. Cox, et al., "VLSI Performance compensation for Off–Chip Drivers and Clock Generation", IEEE 1989 Custom Integrated Circuits Conference, pp. 14.3.1–14.3.4.

International Search Report dated Jun. 28, 1995 for International Application No. PCT/US95/01726.

DELAY-LOCKED LOOP

This is a continuation of application Ser. No. 08/196,583, filed Feb. 15, 1994 now abandoned.

BACKGROUND OF THE INVENTION

1. Field of the Invention

The present invention relates to a circuit to generate periodic signals such as clock signals. More particularly, the present invention relates to a delay locked loop.

2. Art Background

Many high speed electrical systems possess critical timing requirements which dictate the need to generate a periodic clock wave form that possesses a precise time relationship with respect to some reference signal. Conventionally, a phase locked loop (PLL) which employs a voltage control oscillator (VCO) is used to provide the desired clock signal. An example of a PLL is shown in FIG. 1a. However, VCO-based PLLs have some undesirable characteristics. For example, acquisition of the desired timing relationship which requires multiple iterations of signal through the PLL is often slow (typically many hundreds or thousands of clock cycles) because of the time required to drive the VCO to the correct frequency. Furthermore, designing VCOs with ample power supply rejection characteristics is difficult, particularly when implementing circuitry in CMOS, as power supply voltages utilized in such circuitry are designed to be lower and lower to conserve power. An alternative PLL circuit is the delay locked loop (DLL) which generates an output signal a predetermined delay from the input reference signal. A block diagram illustration is shown in FIG. 1b.

SUMMARY OF THE INVENTION

It is therefore an object of the present invention to provide a delay locked loop that eliminates the need for a voltage controlled oscillator (VCO) and provides both rapid acquisition and the minimization of power supply induced jitter. Another object is to provide a DLL with an unlimited phase shift range.

In the circuit of the present invention a phase detector compares the phase of the output of the delay lock loop (DLL) with that of a reference input. The output of the phase comparator is a binary signal which indicates whether the output signal of the DLL is ahead or behind the reference input signal in phase and drives a differential charge pump which functions to integrate the phase comparator output signal over time. The charge pump output controls a phase shifter that adjusts the phase of the DLL output so that the output of the phase comparator is in one state, for example, a high state, 50% of the time on average. Because the DLL adjusts the phase shifter until the output of the phase detector is in one state 50% of the time, on average, the output of the DLL is a signal that has a desired time relationship with the reference clock input, independent of temperature, supply voltage and process. For example, in one embodiment, the DLL may be used to generate a sampling clock for data receivers elsewhere in a system. In such a case, a replica data receiver would be used as the phase detector. In an alternative embodiment, a quadrature phase detector would be used to generate an output clock in quadrature with the reference clock input. This may be used to generate the timing necessary to transmit an output signal.

In one embodiment of the DLL of the present invention, the incoming clock signal is first processed through a duty cycle corrector which produces an output clock waveform that possesses a 50% duty cycle independent of the input duty cycle. The duty cycle corrected signal is then input to the phase shifter. Optionally, a second duty cycle corrector may be employed to process the output signal of the phase shifter to compensate for any duty cycle distortion caused by the phase shifter and/or subsequent buffer amplifiers. The embodiment further includes a phase shifter that has unlimited range.

In addition, the embodiment preferably includes circuitry to minimize jitter. For example, increasing the current to the charge pump in the circuit is one way to reduce acquisition time. However, as the current is increased, so is the amount of jitter generated. To reduce acquisition time without incurring excessive jitter, the DLL includes circuitry to selectively generate boosted charge pump current. The boosted charge pump current is generated only during the acquisition process, during which the signal is synchronized to the reference. When not in the acquisition process, the current is lowered from the boosted amount in order that the amount of jitter generated is decreased. A control signal is used to signal the start and end of acquisition and therefore controls the amount of current input to the charge pump. Thus, during non-acquisition phases of the process, the current is decreased, thereby minimizing jitter.

BRIEF DESCRIPTION OF THE DRAWING

The objects, features and advantages of the present invention will be apparent to one skilled in the art from the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention unnecessarily.

The delay locked loop (DLL) of the present invention provides for a DLL which employs a phase shifting element that provides a continuously adjusting phase shift. Furthermore, the DLL of the present invention possesses superior jitter characteristics that permits more rapid acquisition with minimum jitter.

Figure 1A:
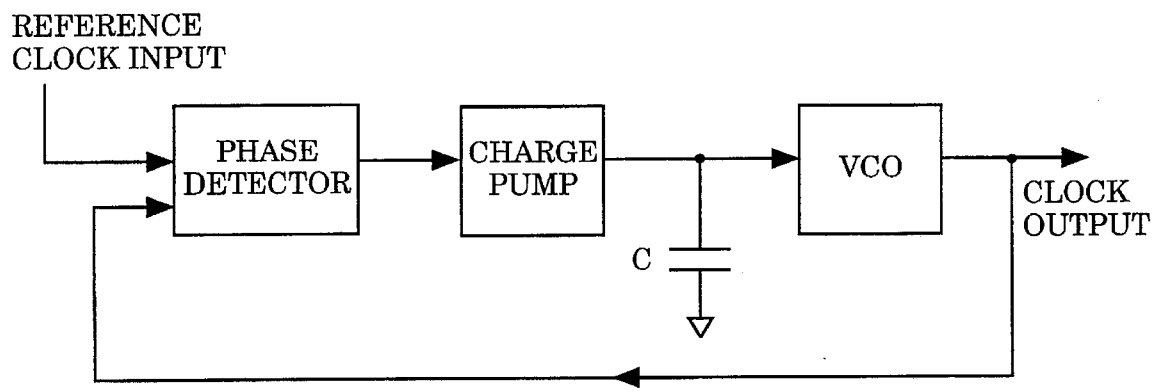
FIG. 1a illustrates a prior art phase locked loop.
Figure 1B:
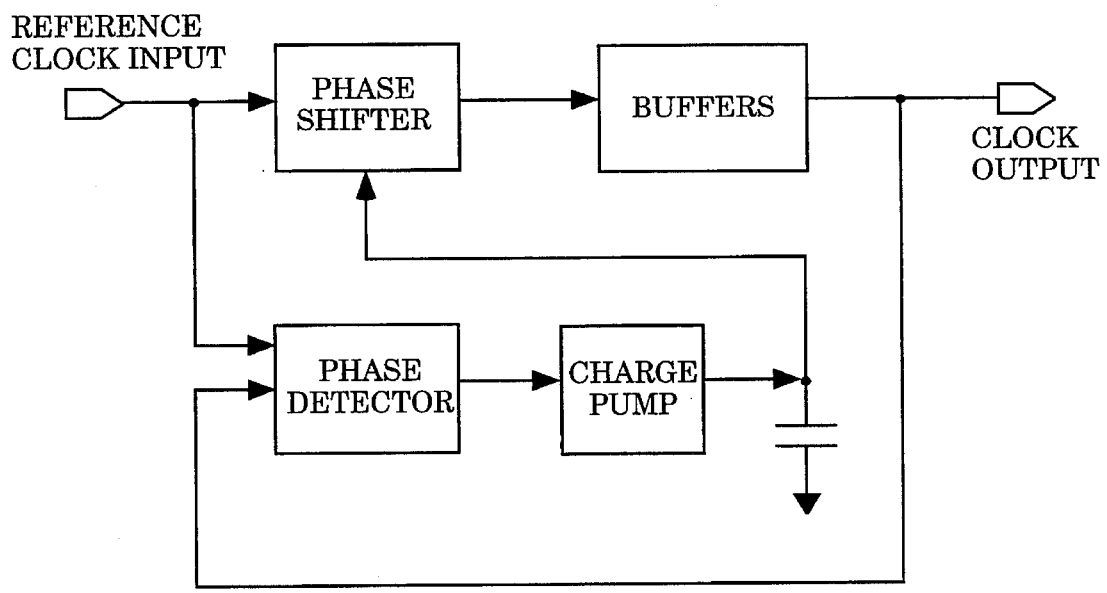
FIG. 1b illustrates a prior art delay locked loop.
Figure 2:
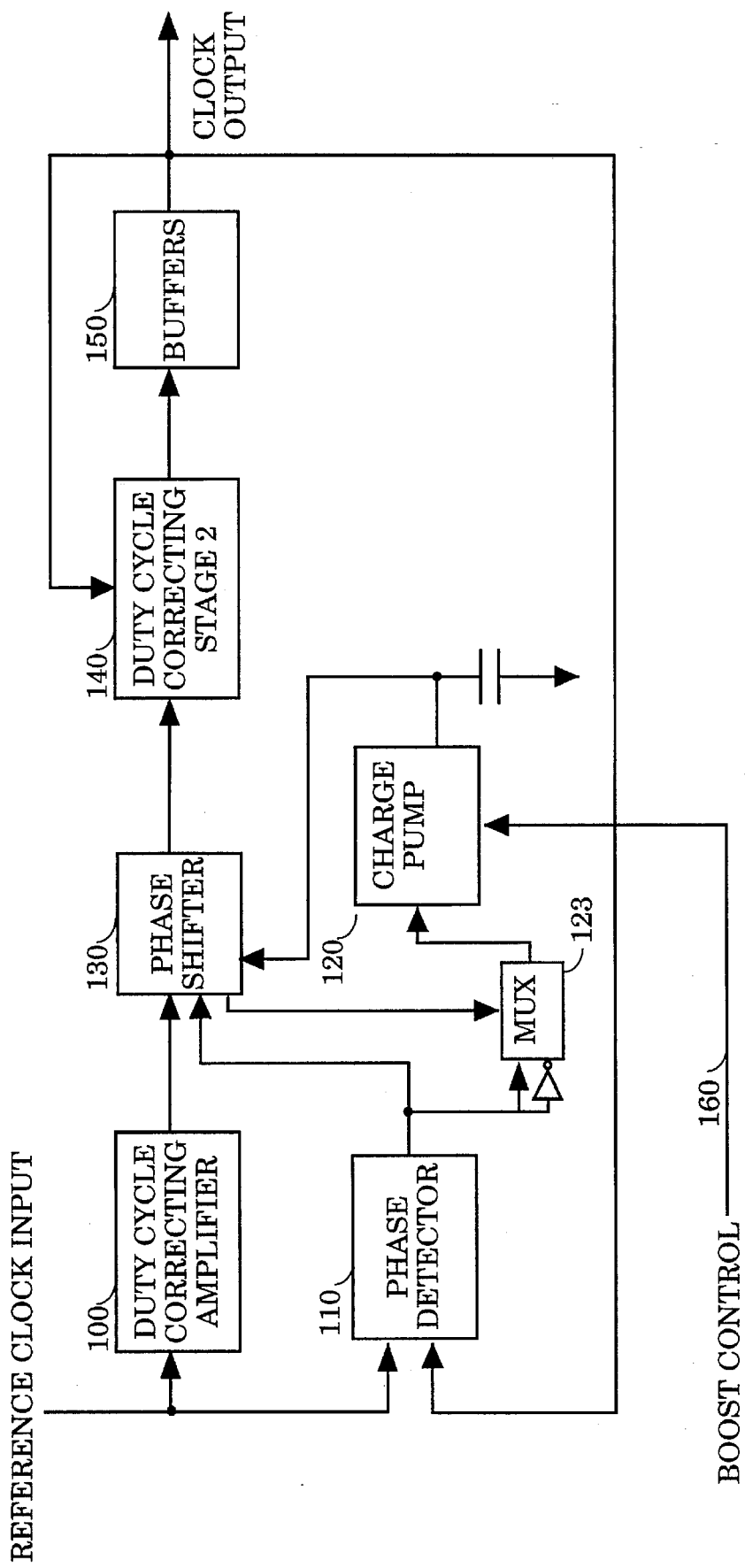
FIG. 2 illustrates one embodiment of the delay locked loop of the present invention.

A simplified block diagram of one embodiment of the DLL is shown in FIG. 2. The reference signal, such as a clock signal, is input to a duty cycle correcting amplifier 100 and a phase detector 110. Phase detector 110 compares the phase of the output signal of the delay locked loop with that of the reference signal input. The reference signal input represents the signal to be corrected using the DLL. Preferably, the phase detector 110 is a phase comparator wherein the output of the phase detector is a binary signal that is high if the feedback clock input, that is the output of the DLL, is ahead in phase of the reference clock input and low if the feedback clock input is behind the reference clock input. Alternately, the phase detector can be configured to generate a low output if the feedback clock input is ahead in phase of the reference clock input and generate a high output if the feedback clock input is behind the reference clock input. The output of the phase comparator drives a charge pump 120, preferably a differential charge pump, which functions to integrate the phase comparator output signals over time. The charge pump 120 output controls the phase shifter 130. The phase shifter 130 adjusts the phase of the reference signal input to the duty cycle correcting amplifier 100, so that the output of the phase comparator is high 50% of the time, on average. The DLL generates the output signal by delaying the input signal. The output signal dithers ahead and behind the desired relationship such that the phase difference detected between the reference signal and the output signal of the DLL is 50% of the time ahead and 50% of the time behind, to provide an average phase relationship which corresponds to the desired timing relationship between the output signal and the reference input signal.

However, by generating the output signal by delaying the input clock signal, the input clock signal may produce a deleterious effect on the performance of the DLL. Specifically, variations in duty cycle of the input signal from the norm, for example, a 50% duty cycle, negatively impacts the performance of the DLL. Conventional PLLs, to the contrary, are largely insensitive to the duty cycles of the incoming signal. To minimize this problem, a duty cycle correcting amplifier 100 is used. Duty cycle correcting amplifier 100 receives the input signal and produces an output signal that possesses a 50% duty cycle independent of the input signal duty cycle. The output of the duty cycle correcting amplifier 100 is input to phase shifter 130. Optionally, a second duty cycle correcting amplifier 140 may be employed to compensate for any duty cycle distortion to the signal caused by the phase shifter and/or subsequent buffer amplifiers 150. Buffer amplifiers 150 restore the signal to full rail to function as the signal output of the circuit.

The DLL of the present invention does not employ proportional control; i.e., the output of the phase detector is not proportional to the size of the phase error. Rather, the DLL is constructed such that the phase of the DLL output signal actually dithers around the desired value. As dithering is a form of jitter, it is desirable to minimize jitter to the greatest practical extent by choosing the amount of phase correction per clock cycle to be appropriately small by, for example, choosing a suitably small ratio of charge pump current to integrating capacitance. Unfortunately, by minimizing jitter, acquisition time, that is, the time required to acquire the desired relationship between the DLL output signal and the reference signal, is not minimized as the smaller the current used, the greater the acquisition time.

Therefore, to reduce acquisition time without incurring excessive dither jitter, it is preferred that the DLL includes circuitry to boost charge pump currents during acquisition. By boosting charge pump currents during acquisition, acquisition speed is increased. However, by keeping currents to a minimum while not in acquisition, the amount of jitter generated is minimized. To boost charge pump currents during acquisition, a boost control signal 160 is used to signal the start and end of the acquisition mode whereby, during acquisition mode, the charge pump currents are increased and when not in acquisition mode, charge pump currents are decreased, thereby minimizing dither jitter. Alternately, the maximization of acquisition speed may be controlled by the DLL circuit itself rather than by an external control signal as shown in FIG. 2. For example, the DLL circuit may include logic to determine if the deviation from the reference clock is greater than a predetermined value, at which time the charge pump currents should be increased to increase the speed of acquisition. When the desired timing relationship is achieved, the logic returns the charge pump circuits to their low jitter values.

As noted above, the phase detector functions to determine the phase difference between the input signal and the signal output from the DLL. In one embodiment, the phase detector utilized is a quadrature phase detector which causes the DLL to produce an output signal that is in quadrature (i.e., possesses a 90° phase shift) with the input signal. Exemplary phase detectors are illustrated in FIGS. 3a and 3b.

Figure 3A:
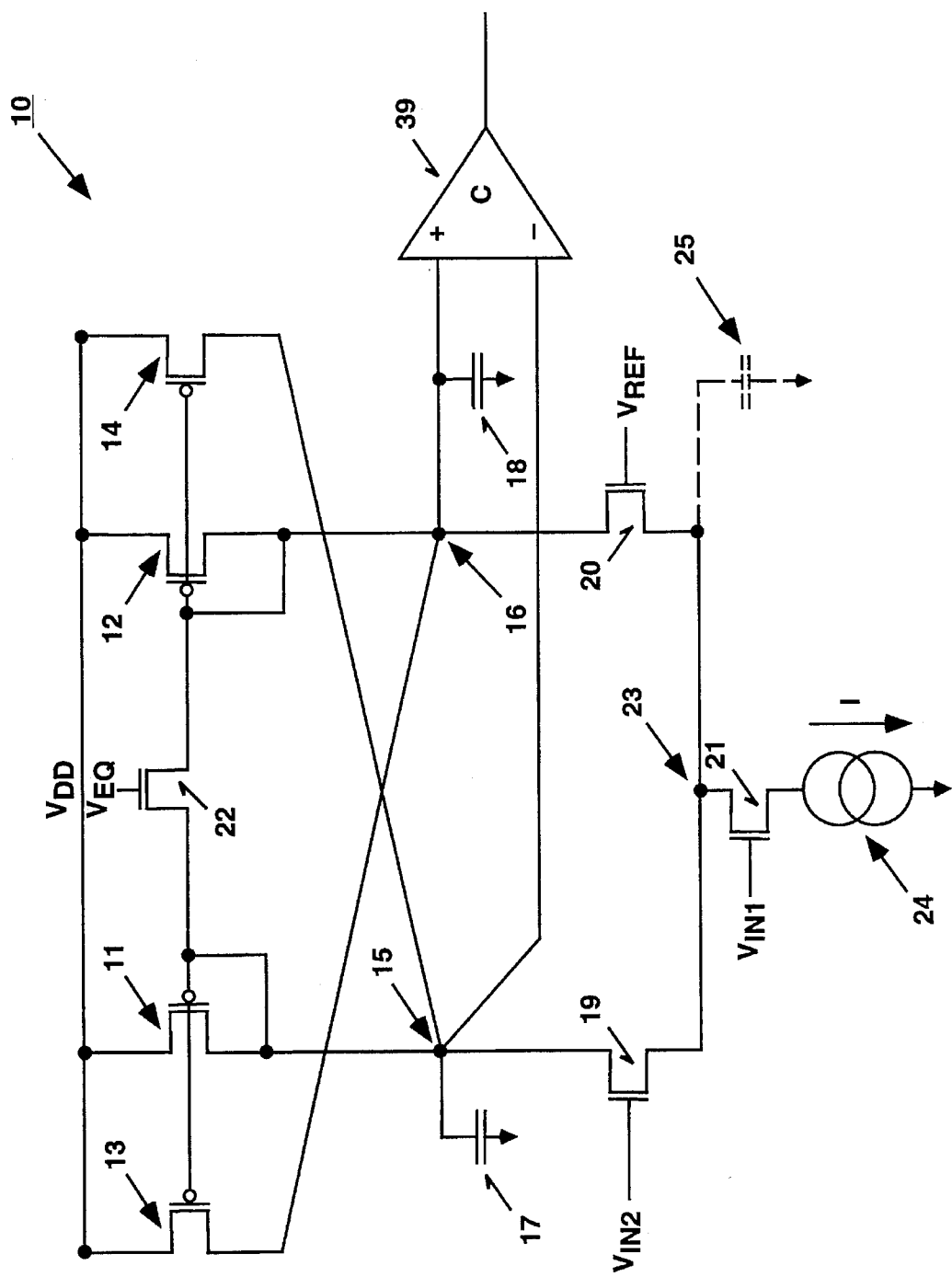
FIGS. 3a and 3b illustrate embodiments of a quadrature phase detector utilized in embodiments of the delay locked loop of the present invention.
Figure 3B:
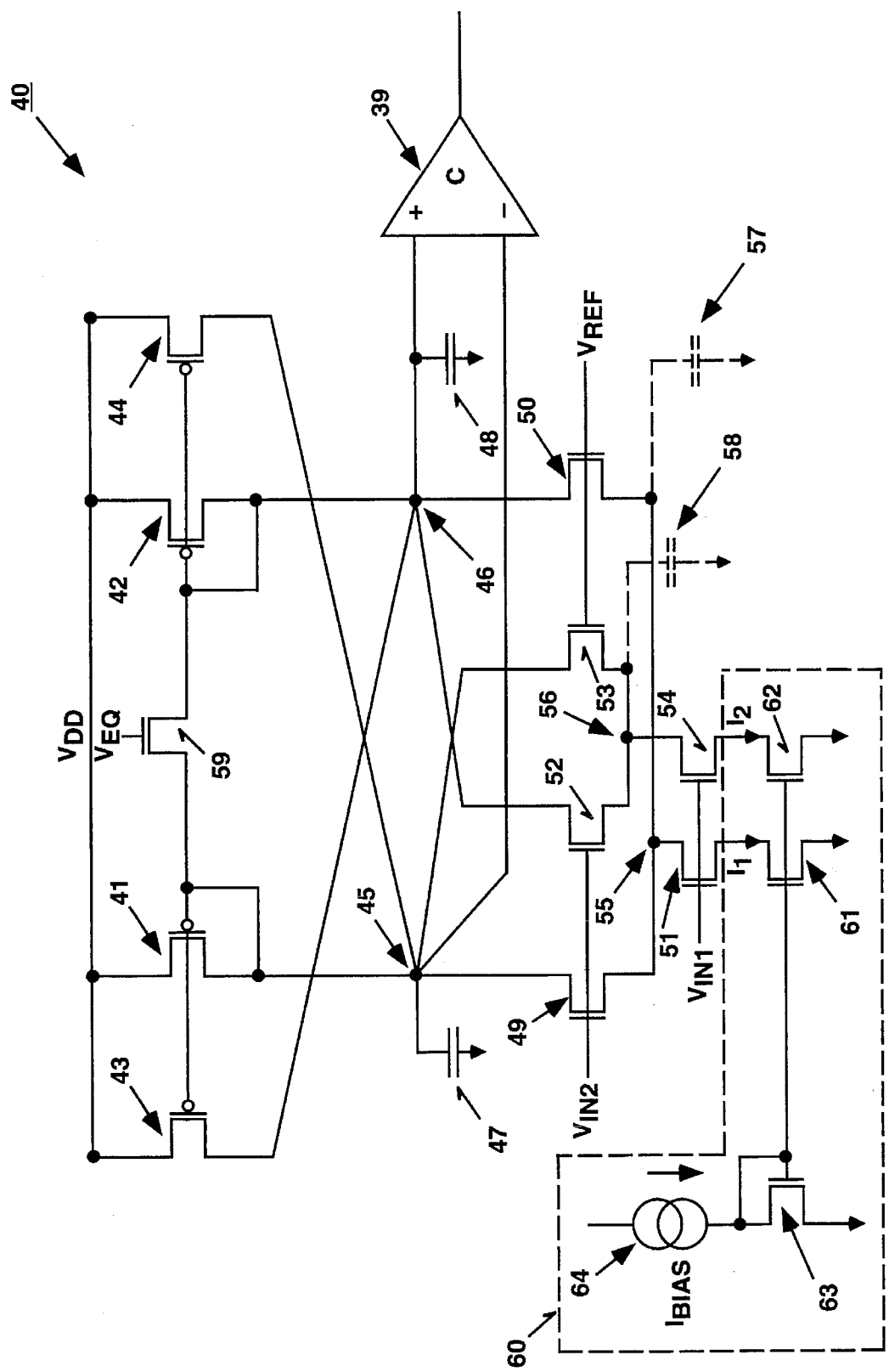

FIG. 3a illustrates one embodiment of a quadrature phase detector 10 which detects the quadrature phase error between two input signals that are in quadrature phase relationship and have different voltage swing characteristics. FIG. 3b illustrates an alternate embodiment of quadrature phase detector 40 which minimizes the phase detection error induced by parasitic capacitance.

Referring to FIG. 3a, Phase detector 10 includes transistors 11 through 14 and 19 through 21. For one embodiment, transistors 11–14 and 19–21 are metal oxide semiconductor field effect transistors ("MOSFETs") and are in a complementary metal oxide semiconductor ("CMOS") configuration. For other embodiments, transistors 11–14 and 19–21 can be N-channel MOSFET transistors or P-channel MOSFET transistors. For alternative embodiments, other devices, such as bipolar transistors, may be used.

As illustrated, transistors 11–14 are P-channel transistors that are connected as current sourcing transistors between a power supply voltage $V_{DD}$ and nodes 15 and 16. Alternatively, transistors 11–14 can be N-channel transistors or bipolar transistors.

Transistors 11–14 together constitute the load of phase detector 10. Transistors 11–14 present a high differential impedance between nodes 15–16 and a low common mode resistance from the power supply $V_{DD}$ to nodes 15–16. Diode connected transistors 11–12 serve as a low common mode resistance between the power supply $V_{DD}$ and nodes 15–16. Transistors 11–12 also constitute a positive differential load resistance between nodes 15 and 16. Transistors 13–14 constitute a negative differential load resistance between nodes 15 and 16. The negative differential load resistance cancels the positive differential load resistance. As a result, transistors 11–14 together present the high differential load resistance between nodes 15 and 16. The connection of transistors 11–14 is described below.

Alternatively, other types of load circuits can be used in phase detector 10 between the power supply $V_{DD}$ and nodes 15–16. In addition, the load formed by transistors 11–14 can be any other kind of high differential impedance load circuit.

The drain of transistors 11 and 14 are connected to node 15 and the drain of transistors 12 and 13 are connected to node 16. Each of transistors 11–12 has its gate coupled to its drain. In addition, the gate of transistor 13 is connected to the gate of transistor 11, and the gate of transistor 14 is connected to the gate of transistor 12. Because the gates of transistors 11 and 13 are connected together and the gates of transistors 12 and 14 are connected together, transistor 13 mirrors the current through transistor 11 and transistor 14 mirrors the current through transistor 12. In other words, transistors 11 and 13 constitute a current mirror and transistors 12 and 14 constitute another current mirror. By mirroring the current flowing through transistor 11 to node 16 and by mirroring the current flowing through transistor 12 to node 15, each of nodes 15–16 receives substantially the same amount of current and no differential current is generated. This therefore causes transistors 11–14 to present a high differential load resistance because the negative differential load resistance generated by transistors 13–14 cancels the positive differential load resistance generated by transistors 11–12. In one embodiment, transistors 11–14 are substantially identical in size such that the negative differential load resistance generated by transistors 13–14 cancels the positive differential load resistance generated by transistors 11–12.

Nodes 15–16 form the output of the phase detector 10. A capacitor 17 is connected between ground and node 15 and a capacitor 18 is connected to node 16 and ground. For one embodiment, capacitors 17 and 18 have substantially equivalent capacitance. As illustrated, capacitors 17 and 18 include parasitic capacitances of transistors 11–14 at nodes 15–16, respectively. However, capacitors 17 and 18 may also be identified not to include the parasitic capacitances of transistors 11–14 at nodes 15–16, respectively.

Node 15 is further connected to the drain of transistor 19 and node 16 is further connected to the drain of transistor 20. The sources of transistors 19–20 are connected to a node 23. Node 23 is then connected to the drain of transistor 21. Transistor 21 has its source connected to ground via a current source 24. The gate of transistor 19 receives an input signal $V_{IN2}$. The gate of transistor 20 receives an input signal $V_{REF}$. The gate of transistor 21 receives an input signal $V_{IN1}$. Transistors 19–21 are N-channel transistors. Alternatively, transistors 19–21 can be P-channel transistors or bipolar transistors. For one embodiment, transistor 19 has a size that is substantially equal to that of transistor 20.

For purposes of the present discussion, the $V_{IN1}$ signal exhibits a full CMOS voltage swing. The $V_{IN2}$ signal, in a quadrature phase relationship with $V_{IN1}$, is a small voltage swing signal that oscillates substantially symmetrically around the $V_{REF}$ reference voltage (which is a constant DC reference voltage). The $V_{IN2}$ signal is therefore referred to as quasi-differential signal. Therefore, it can be seem that the $V_{IN2}$ and $V_{REF}$ signals are not complementary to each other.

Alternatively, the $V_{IN2}$ signal is a small swing, fully differential signal that swings between a $V_{high}$ voltage and a $V_{low}$ voltage. In this case, the $V_{REF}$ signal is complementary to the $V_{IN2}$ signal. Thus, when the gate of transistor 19 receives the $V_{high}$ voltage, the gate of transistor 20 receives the $V_{low}$ voltage.

Transistors 19–21 detect the quadrature phase error of the $V_{IN1}$ and $V_{IN2}$ input signals. The $V_{IN1}$ and $V_{IN2}$ signals are desired to have a quadrature phase relationship. When quadrature phase error occurs (i.e., the desired quadrature phase relationship has not been achieved), phase detector 10 detects that condition by producing a net differential voltage across nodes 15–16 (i.e., the output $V_{OUT}$) at the end of each measurement cycle. The voltage level of the net differential voltage across nodes 15–16 is a function of the amount of quadrature phase error between the $V_{IN1}$ and $V_{IN2}$ input signals. If phase detector 10 does not detect any quadrature phase error, phase detector 10 does not produce any net differential voltage across nodes 15–16 at the end of the detection cycle.

Phase detector 10 also includes a transistor 22 coupled between nodes 15–16. Transistor 22 is an N-channel MOSFET transistor. Alternatively, transistor 22 can be a P-channel MOSFET transistor or a bipolar transistor. Transistor 22 is used in phase detector 10 as an equalizing transistor. Transistor 22 causes the voltage difference across nodes 15–16 to be zero when transistor 22 conducts before a measurement cycle is initiated. Transistor 22 is switched on or off by the $V_{EQ}$ signal. When transistor 22 is turned on by the $V_{EQ}$ signal, nodes 15 and 16 are connected together via transistor 22 and the voltages at nodes 15–16 are equalized. Preferably, the $V_{EQ}$ signal is a periodic pulse signal that occurs before every pulse of the $V_{IN1}$ signal. The $V_{EQ}$ signal helps to equalize the voltages across nodes 15–16 for starting a detection cycle. Alternatively, the pulse cycle of the $V_{EQ}$ signal can occur before every Nth pulse of the $V_{IN1}$ signal.

The operation of phase detector 10 is now described. Transistor 21 connects a current I from node 23 to current source 24 when the $V_{IN1}$ signal is at the high $V_{DD}$ voltage. Because transistor 21 is connected to current source 24, transistor 21, when conducting, only allows the amount of current I to flow through. The $V_{IN1}$ signal controls the start of each detection cycle. Whenever the voltage level of the $V_{IN1}$ signal rises to the $V_{DD}$ voltage, a detection cycle is initiated.

When the voltage level of the $V_{IN2}$ signal is higher than that of the $V_{REF}$ voltage and when the $V_{IN1}$ signal is at the $V_{DD}$ voltage (e.g., from time $t_1$ to time $t_2$), transistor 19 conducts more than transistor 20 does. Transistor 19 thus contributes substantially all the I current to node 23. Because each of nodes 15 and 16 receives substantially the same amount of current from the load element formed by transistors 11–14, capacitor 17 is charged differently than capacitor 18 if transistors 19 and 20 are not drawing the same amount of current to node 23. In this case, capacitor 18 may be charging while capacitor 17 is discharging. This in turn generates a differential voltage across nodes 15–16, and therefore at the output $V_{OUT}$ of phase detector 10. The differential voltage at the output $V_{OUT}$ ramps linearly upwards for the time that the voltage of the $V_{IN2}$ signal is higher than the $V_{REF}$ reference voltage.

When the voltage level of the $V_{IN2}$ signal is lower than that of the $V_{REF}$ voltage and when the $V_{IN1}$ signal is at the $V_{DD}$ voltage (e.g., from time $t_2$ to time $t_3$), transistor 20 then contributes substantially all the I current to node 23. This in turn causes the charging of capacitors 17–18 to be uneven. In this case, capacitor 17 may be charging while capacitor 18 is discharging. This then results in the differential voltage at the output $V_{OUT}$ of phase detector 10 to drop linearly downwards.

When the voltage level of the $V_{IN1}$ signal goes to ground, the differential voltage at the output $V_{OUT}$ stops changing. If the $V_{IN1}$ and $V_{IN2}$ signals are in perfect quadrature, the differential voltage across nodes 15–16 ramps linearly towards zero and no net differential voltage will be developed at the $V_{OUT}$ output of phase detector 10 at the time when the $V_{IN1}$ signal goes to ground. If, however, a quadrature phase error exists between the $V_{IN1}$ and $V_{IN2}$ signals, a net differential voltage will be developed across nodes 15–16 at the end of the phase detection cycle. The net differential voltage across nodes 15–16 is substantially proportional to the amount of the quadrature phase error.

Preferably the output $V_{OUT}$ of phase detector 10 is connected to a comparator 39 to generate a binary quadrature phase error output. Other circuits may also be used to generate the binary quadrature phase error output.

The above description of phase detector 10 in detecting the quadrature phase error, however, assumes the desirable situation in which the influence of any parasitic capacitance 25 of transistors 19 through 21 at node 23 (as well as other parasitic capacitances in the circuit) is negligible. Since transistor 21 is used as a switch, parasitic capacitor 25 includes the parasitic capacitance between the source of transistor 21 and ground.

Due to the existence of parasitic capacitor 25 in the circuit of phase detector 10, phase detector 10 generates a net differential voltage at the output $V_{OUT}$ of the circuit at the end of a detection cycle even when the $V_{IN1}$ and $V_{IN2}$ signals are in the perfect quadrature phase relationship.

The embodiment illustrated by FIG. 3b eliminates the net differential voltage occurring at the output of the circuit due to the parasitic capacitance. Referring to FIG. 3b, phase detector 40 includes transistors 41 through 44 connected between the power supply $V_{DD}$ and nodes 45 and 46. The connection and function of transistors 41–44 in phase detector 40 are identical to that of transistors 11–14 in phase detector 10 of FIG. 3a.

Node 45 is connected to capacitor 47 and capacitor 48 is connected to node 46. The capacitance of capacitor 48 is substantially equal to that of capacitor 47. Nodes 45–46 are then connected to a first circuit formed by transistors 49 through 51 and a second circuit formed by transistors 52 through 54. Transistors 51 and 54 are then connected to a circuit 60, which essentially includes a first current source for providing a first current $I_1$ through transistors 51 and a second current source for providing a second current $I_2$ through transistor 54, as can be seen from FIG. 3b. Both the $I_1$ and $I_2$ currents are generated and controlled by a $I_{BIAS}$ current.

Circuit 60 generates the $I_1$ and $I_2$ currents. The value of the $I_2$ current is smaller than that of the $I_1$ current. For one embodiment, the value of the $I_2$ current is in a range of 20% to 30% of the $I_1$ current. For alternative embodiments, the value of the $I_2$ current can be larger or smaller than 20% to 30% of the $I_1$ current.

For one embodiment, transistors 49–51 and 52–54 are N-channel MOSFET transistors. For alternative embodiments, transistors 49–51 and 52–54 can be P-channel MOSFET transistors or bipolar transistors. For one embodiment, the size of each of transistors 52–53 is substantially equal to that of each of transistors 49–50 and the size of transistor 54 is substantially equal to that of transistor 51.

Transistor 49 is connected to node 45 and node 55. Transistor 50 is connected to nodes 46 and 55. Transistor 51 connects node 55 to ground via the current source $I_1$ formed by circuit 60. Similarly, transistor 52 is connected to node 46 and a node 56. Transistor 53 is connected to nodes 45 and 56. Transistor 54 connects node 56 to ground via the current source $I_2$ formed by circuit 60. The gate of each of transistors 51 and 54 receives the $V_{IN1}$ signal. The gate of each of transistors 49 and 52 receives the $V_{IN2}$ signal and the gate of each of transistors 50 and 53 receives the $V_{REF}$ voltage.

A parasitic capacitor 57 is connected to node 55 and ground and a parasitic capacitor 58 connected to node 56 and ground. Parasitic capacitor 57 includes the parasitic capacitance of transistors 49–51 at node 55 and parasitic capacitor 58 includes the parasitic capacitance of transistors 52–54 at node 56. Parasitic capacitor 57 also includes other parasitic capacitances in the circuit. Since transistor 51 is used as a switch, parasitic capacitor 57 includes the parasitic capacitance between the source of transistor 51 and ground. Likewise, parasitic capacitor 58 also includes other parasitic capacitances in the circuit. Because transistor 54 is used as a switch, parasitic capacitor 58 includes the parasitic capacitance between the source of transistor 54 and ground.

Transistors 49–51 detect the phase error of the $V_{IN1}$ and $V_{IN2}$ signals. Transistors 52–54 cancel the net differential voltage at the output $V_{OUT}$ of phase detector 40 due to parasitic capacitor 57 in the circuit. As described above, each of transistors 52–53 has a size that is substantially equal to that of each of transistors 49–50. Therefore, the capacitance of parasitic capacitor 58 is substantially equal to that of parasitic capacitor 57. Due to the negative cancellation effect of transistors 52–54, the additional error currents generated in the circuit due to parasitic capacitors 57–58 cancel each other and the phase detector 40 does not experience a net differential voltage generated at the output $V_{OUT}$ of the circuit due to the parasitic capacitance of the circuit. Because the capacitance of parasitic capacitors 57–58 is substantially equal, the additional error currents associated with parasitic capacitors 57–58 are also substantially equal. Transistors 49–50 and 52–53 are, however, cross-connected such that their respective contributions subtract from each other. This causes the additional error currents to cancel each other and allows phase detector 40 to detect the quadrature phase error of the $V_{IN1}$ and $V_{IN2}$ signals with minimized phase detection error.

The operation will now be discussed. When transistor 51 is turned on by the logical high $V_{IN1}$ signal, the voltage level at node 55 does not change immediately, causing the current flowing through transistor 51 to exceed the current $I_1$, which generates an additional error current. Since the voltage level of the $V_{IN2}$ signal is higher than the $V_{REF}$ voltage at this time, this additional error current flows through transistor 49, causing capacitor 47 to be additionally discharged. Meanwhile, since transistor 54 is also turned on by the logical high $V_{IN1}$ signal, the voltage level at node 56 does not change immediately, which also generates an additional error current flowing through transistor 54. As the voltage level of the $V_{IN2}$ signal is higher than the $V_{REF}$ voltage at this time, an additional error current flows through transistor 52, causing capacitor 48 to be additionally discharged. Because the capacitance of parasitic capacitor 57 is equal to that of parasitic capacitor 58, the additional error current that flows through transistor 52 is substantially equal to the additional error current through transistor 49. Given that transistor 52 is connected to node 46 while transistor 49 is connected to node 45, the additional error current generated by transistor 52 cancels that generated by transistor 49.

When the voltage level of the $V_{IN2}$ signal is lower than that of the $V_{REF}$ voltage, transistor 49 is much less conducting than transistor 50 and transistor 52 is much less conducting than transistor 53. At this time, the voltage level at each of nodes 55 and 56 falls. This causes parasitic capacitors 57 and 58 to be discharged, reducing the current flowing through transistors 50 and 53, respectively. This then causes an additional error current to flow through transistor 50 to capacitor 48 and an additional current to flow through transistor 53 to capacitor 47, additionally charging capacitors 47 and 48, respectively. Given that transistor 50 is connected to node 46 and transistor 53 is connected to node 45 and given that the additional error currents through transistors 50 and 53 are substantially equal to each other, the additional charging to each of capacitors 47 and 48 cancels each other.

In addition, due to parasitic capacitors 57 and 58, the voltage level at each of nodes 55 and 56 does not change immediately after transistors 51 and 54 are turned off by the $V_{IN1}$ signal, causing an additional error current to flow through transistor 50 to parasitic capacitor 51 and an additional error current to flow through transistor 53 to parasitic capacitor 58. The additional error currents cause capacitors 47 and 48 to be additional discharged, respectively. Because the capacitance of parasitic capacitor 57 is substantially equal to that of parasitic capacitor 58, the additional error current flowing through transistor 50 is substantially equal to the additional error current flowing through transistor 53. Given that transistor 50 is connected to node 46 and transistor 53 is connected to node 45, the additional error currents cancel each other. By doing so, no net differential voltage due to parasitic capacitor 58 will be developed at the output $V_{OUT}$ and phase detector 40 detects the quadrature phase error of the $V_{IN1}$ and $V_{IN2}$ signals with minimized detection error. The $V_{OUT}$ output of phase detector 40 is connected to a comparator 39 to generate a binary quadrature phase error output. Alternatively, other circuits can be used to generate the binary quadrature phase error output.

The duty cycle correcting amplifier circuit receives periodic input signals that possess an imperfect duty cycle, and outputs periodic output signals with a corrected duty cycle through the use of active duty cycle correction. In one embodiment, the circuit receives the uncorrected periodic input signal and generates an intermediate signal current reflective of the uncorrected input signal. The intermediate signal current is summed with a correction current which offsets the signal current. The summed current is input to an integrating capacitance. The voltage across the integrating capacitance is clamped to a finite value. The capacitance and clamping voltage are chosen so that the voltage across the capacitor ramps substantially linearly (i.e., slew limits) over a substantial fraction of the period of the input signal. The slew-limited, clamped capacitor voltage signal then drives an amplifier that regenerates a substantially square wave form as output. By varying the amount of the correction current, an uncorrected input signal having a non-linear ramp input (e.g., the rising edge and falling edge of the signal being substantially unequal) can be modified to have a linear input and the duty cycle of the regenerated wave form can be varied over a range constrained mainly by the fraction of the period that is dominated by the slewing process.

Figure 4:
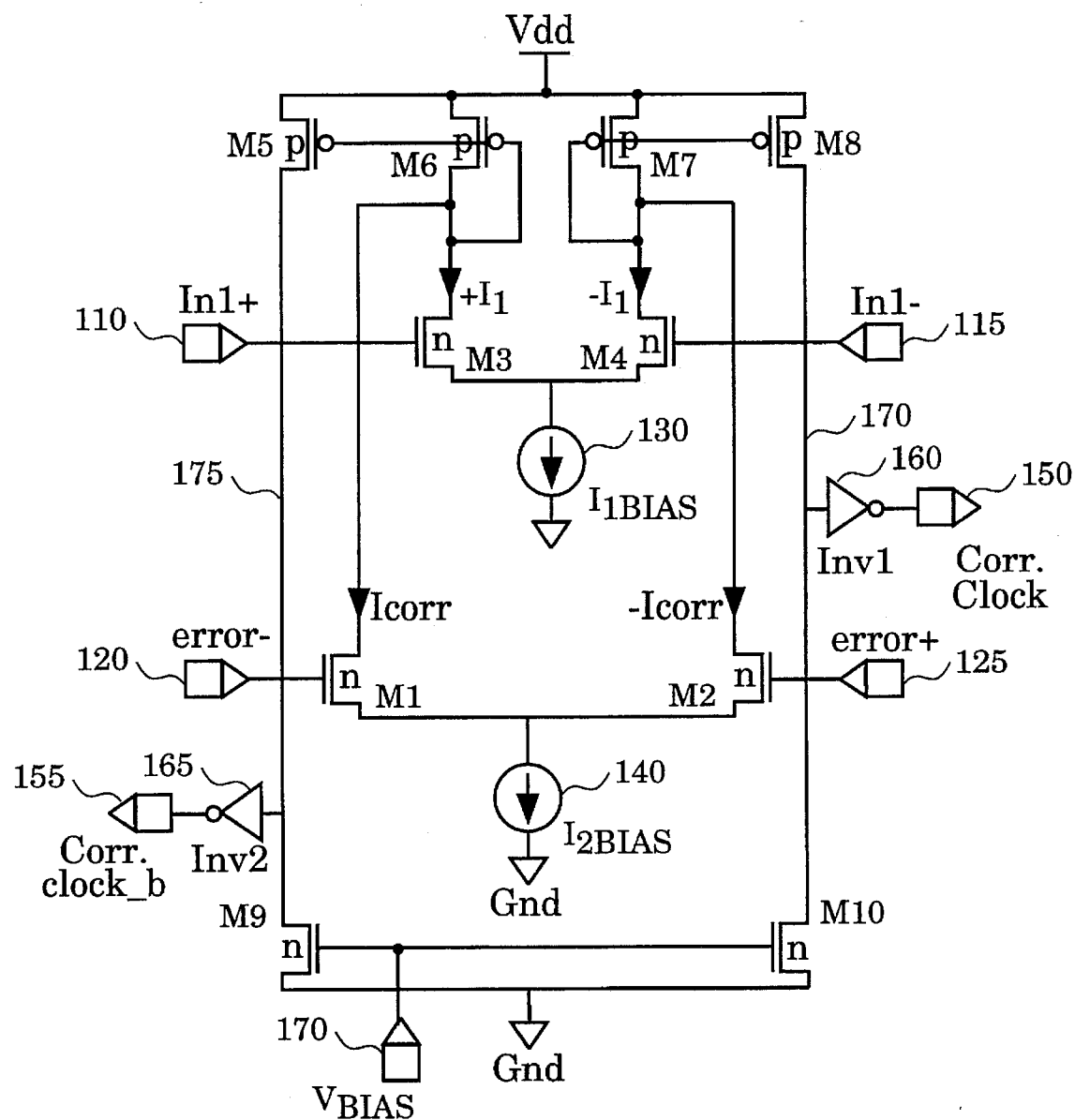
FIG. 4 illustrates one embodiment of a duty cycle correcting amplifier utilized in one embodiment of the delay locked loop of the present invention.

One embodiment of the duty cycle correcting amplifier is shown in FIG. 4. The amplifier receives as input the uncorrected input signal IN1+110 and IN1−115 and the error values, error+125, error−120. The error signals are generated by the duty cycle error measurement circuit which measures the duty cycle error. The output of the circuit is the corrected differential clock signal 150, 155. The circuit consists of two operational transconductance amplifiers (OTAs) connected in parallel. The uncorrected clock signal input 110, 115, drives transistor pair M3, M4. The gain of transistors M3 and M4 are made sufficiently high so that substantially all of the bias current $I_{1BIAS}$ 130 flows alternately through transistors M3 and M4, depending upon the polarity of the input signal. The duty cycle error signal 120, 125, generated by the duty cycle error measurement circuit, drives transistor pair M1 and M2. The output current generated is then added to the current generated by transistors M3 and M4. Inverters Inv1 and Inv2 160, 165 are preferably ideal infinite gain inverters such that the output of the inverter changes state when a predetermined threshold value is crossed thus helping in the formation of the square wave output.

The output of the OTAs are the common drain connection of transistors M8 and M10, node 170, and the common drain connection of transistors M5 and M9, node 175. Preferably the bias currents $I_{1BIAS}$, $I_{2BIAS}$, 130, 140 are chosen in combination with the capacitance associated with the common drain connection and clamping voltage (in the present embodiment, the clamping voltage is substantially equal to the power supply voltage $V_{DD}$) to provide the desired slew limiting characteristics to correct the duty cycle of the input signal. Alternately, a separate capacitance component may be utilized to provide the integrating capacitance functionality. Furthermore, other considerations, such as noise and/or jitter performance, may dictate the greater operating current or explicit additional capacitance connected to the OTA outputs 170, 175. Therefore, an explicit additional capacitance would then be connected to the OTA outputs 170, 175 to provide the necessary slew limiting characteristics. For example, a capacitor may be connected between nodes 170, 175, the drain nodes of transistors M9 and M10. Alternately, separate capacitor components may be connected between node 170 and ground and node 175 and ground.

Figure 5A:
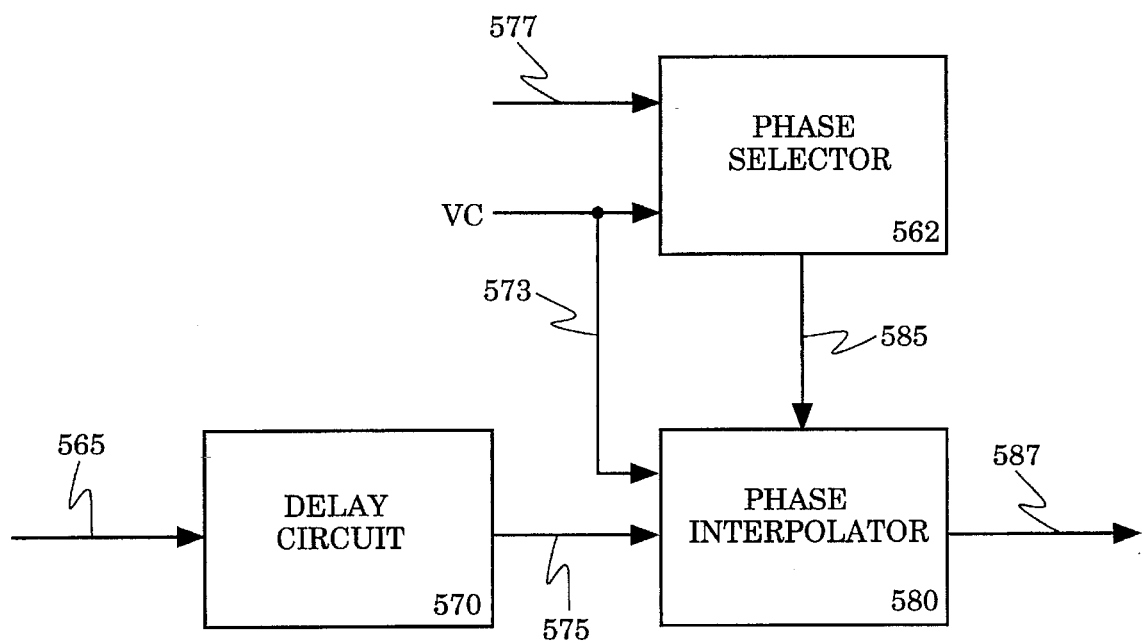
FIGS. 5a, 5b and 5c illustrate one embodiment of the phase shifter utilized in one embodiment of the delay locked loop of the present invention.

FIG. 5a illustrates the phase shifter of one embodiment of the present invention. The phase shifter uses phase mixing to provide an unlimited phase adjustment range. Phase mixing includes the mixing of two intermediate signals of different phase that are derived from the input signal. In the present embodiment, the intermediate signals are four quadrature intermediate signals that have relative phase alignments of zero, 90, 180 and 270 degrees. The output signal always has a phase that falls within a quadrant of the phase plane that is bounded by two of the four intermediate signals. Phase mixing is accomplished by multiplying each intermediate signal that bounds the quadrant in which the phase of the output signal is located by a weighting fraction and summing the results.

The phase shifter 560 includes a delay circuit 570 (with input 565), a phase interpolator 580 and a phase selector 562. The delay circuit 570 outputs four intermediate signals via signal line 575 that are used in the phase mixing process by the phase interpolator 580. In the present embodiment, the delay circuit preferably outputs intermediate signals having relative phase alignments of 0, 90, 180 and 270 degrees. Any fixed delay that results from the delay circuit 570 and the phase interpolator 580 is eliminated from the output signal by virtue of the phase shifter 560 being a component in a feedback loop.

One method for providing quadrature intermediate signals requires that the delay circuit to also perform a frequency divide operation on the input signal such that the frequency of the intermediate signals are one-half that of the input frequency. If this method is implemented, the phase shifter circuit of FIG. 5a can be modified, as shown in FIG. 5c, to include an XOR gate 640 and a second phase interpolator 620 having an output signal that is 90 degrees out of phase with the output of the phase interpolator 610. The outputs of both phase interpolators 610, 620 are the inputs to the XOR gate 640, the XOR gate 640 functioning to double the frequency such that the output frequency of the phase shifter is equal to the input frequency. The circuit of FIG. 5c includes delay circuit 605 having an input 601.

Phase interpolator 620 receives the quadrature intermediate signals via signal lines 606 and 607. The intermediate signals are phase mixed to produce an output signal at signal line 655 having the desired phase shift from the input signal in response to the differential control voltage signal $V_C$ that is received via signal line 608 and the phase select signals that are received from the phase selector 630 via signal lines 615 and 616. Although the present invention is not limited as such, differential control signals and circuits are preferred for improved power supply noise rejection characteristics. The phase selector 630 selects two of the four intermediate signals to be used for phase mixing in response to the differential control voltage signal $V_C$ and a binary phase slope signal provided by the phase detector and is received via signal line 634. The phase slope signal indicates whether the phase shift of the phase shifter 600 must increase or decrease. Control signal line 637 from phase selector 630 is used to reverse the sense of the charge pump 120 (FIG. 2) in alternate quadrants to allow finite control voltage range to correspond to any phase shift (modulo $2\pi$).

Figure 5B:
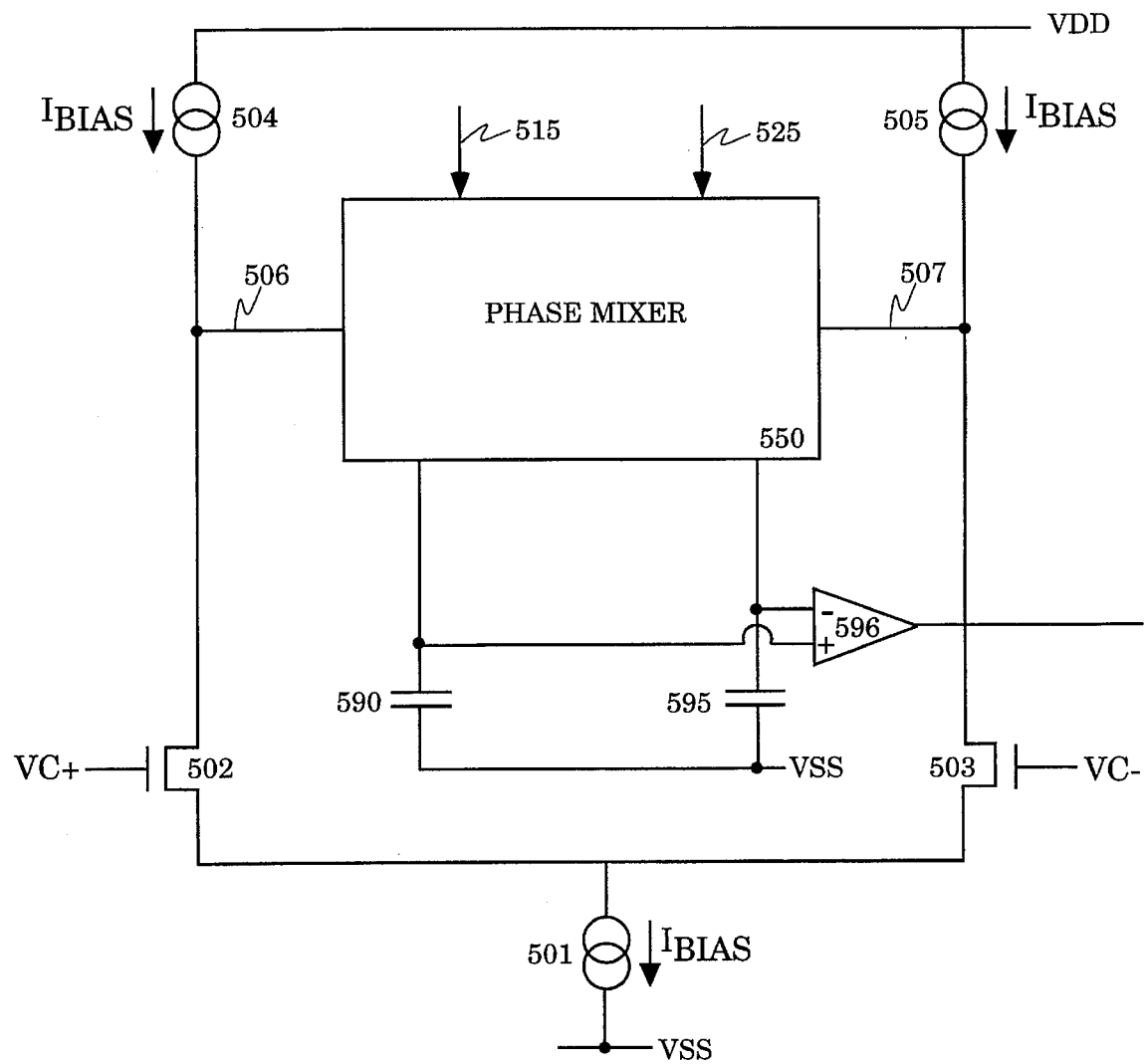
Figure 5C:
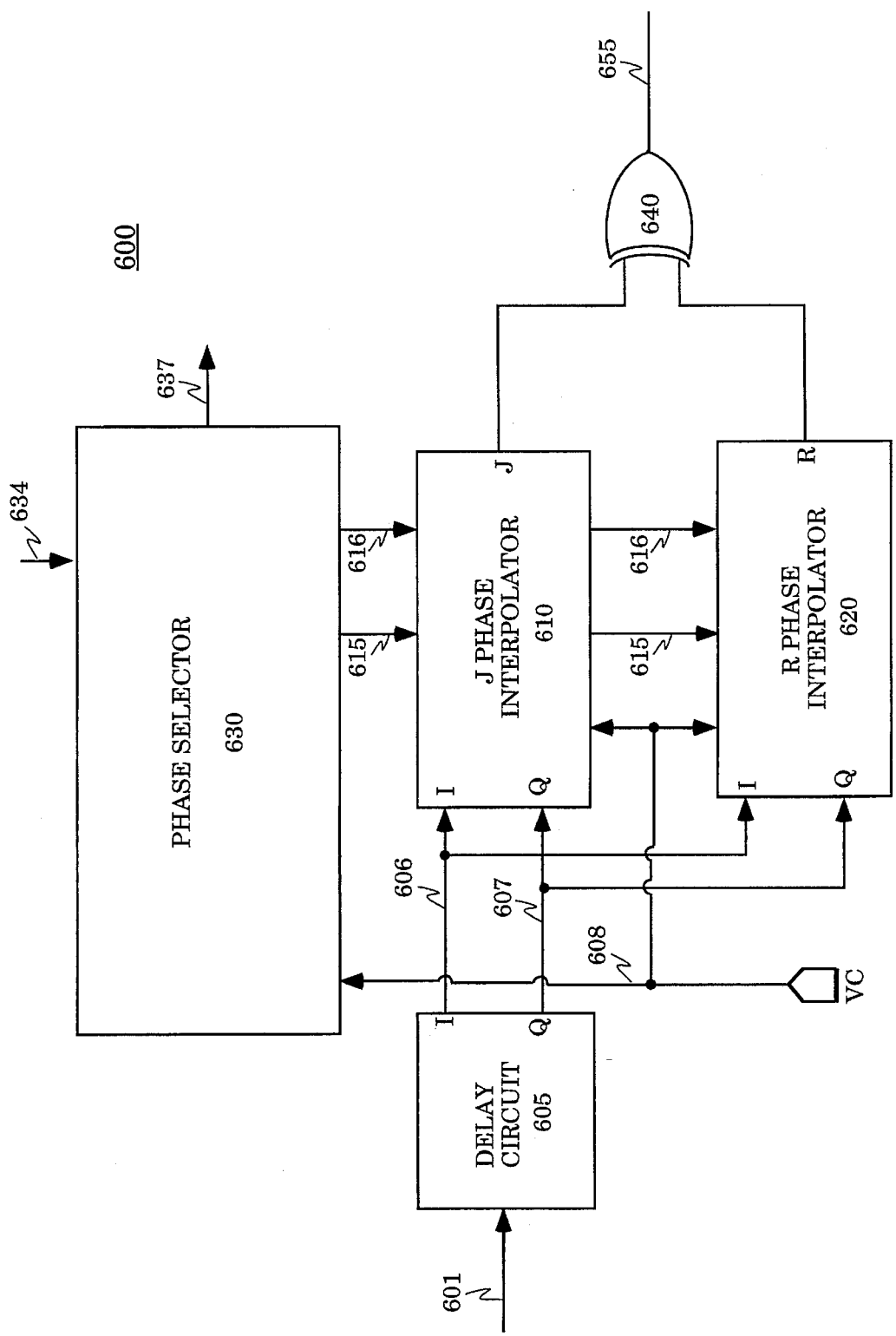

FIG. 5b illustrates one simplified embodiment of the phase interpolator. The phase interpolator includes a differential pair of n-channel field effect transistors (FETs) 502 and 503. The differential control voltages $V_{C+}$ and $V_{C-}$ are coupled to the gates of FETs 502 and 503 respectively. In conjunction with fixed current sources 504 and 505, the differential pair 502 and 503 steers a differential current into branches 506 and 507 under the control of $V_{C+}$ and $V_{C-}$. The currents provided by 504 and 505 are each less than the current provided by current source 501 in the illustrative embodiments to ensure that a finite difference ($V_{C+}$- $V_{C-}$) can result in a zero current in either branch 506 or branch 507.

The value of the differential control voltage VC determines the amount of current that is steered through the right and left halves of the phase interpolator. The current in branch 506 is equal to the difference of the current supplied by current source 504 and the drain current of FET 502. Similarly, the current in branch 507 is equal to the difference of the current supplied by current source 505 and the drain current of 503. When $_{VC}$ is equal to $V_{MAX}$, FET 502 is switched completely on by the $V_{C+}$ differential control voltage such that FET 502 conducts substantially all of the current from current source 501. The negative differential control voltage $V_{C-}$ is negative such that FET 503 is not conducting. This means that current flows through branch 507, and no current flows through branch 506. When $V_C$ is equal to $V_{MIN}$, substantially all of the current provided by current source 501 flows through FET 503. Thus, current flows through branch 506, and no current flows through branch 507. Control voltage levels $V_C$ between $V_{MAX}$ and $V_{MIN}$ allow current to flow through both branches 506 and 507.

The current in the right and left halves of the phase interpolator are used to charge the capacitors 590 and 595, which are coupled to the positive and negative terminals of comparator 596, respectively. The comparator 596 preferably acts as an ideal comparator, as is well-known in the art. Phase mixer 550 determines which two of the four intermediate phase vectors are to be used to couple and decouple the capacitors 590 and 595 from branches 506 and 507 in response to the select signals received via signal line 525. The intermediate signals are received via signal line 515.

As $V_C$ varies, the currents flowing in the capacitors 590 and 595 vary from depending entirely on the first bounding intermediate vector to depending entirely on the second bounding intermediate vector. The relative amount of current that is flowing into each capacitor, as set by the differential control voltage $V_C$, determines the relative rate of charging and discharging of the capacitors. The comparator 596 outputs a logic high when it detects that the voltage at the positive terminal becomes more positive than voltage at the negative terminal. Because the voltages of capacitors 590 and 595 are time varying wave forms, the output of the comparator indicates when the wave forms of the two capacitors intersect. This point of intersection is varied by varying the differential control voltage $V_C$.

Figure 6A:
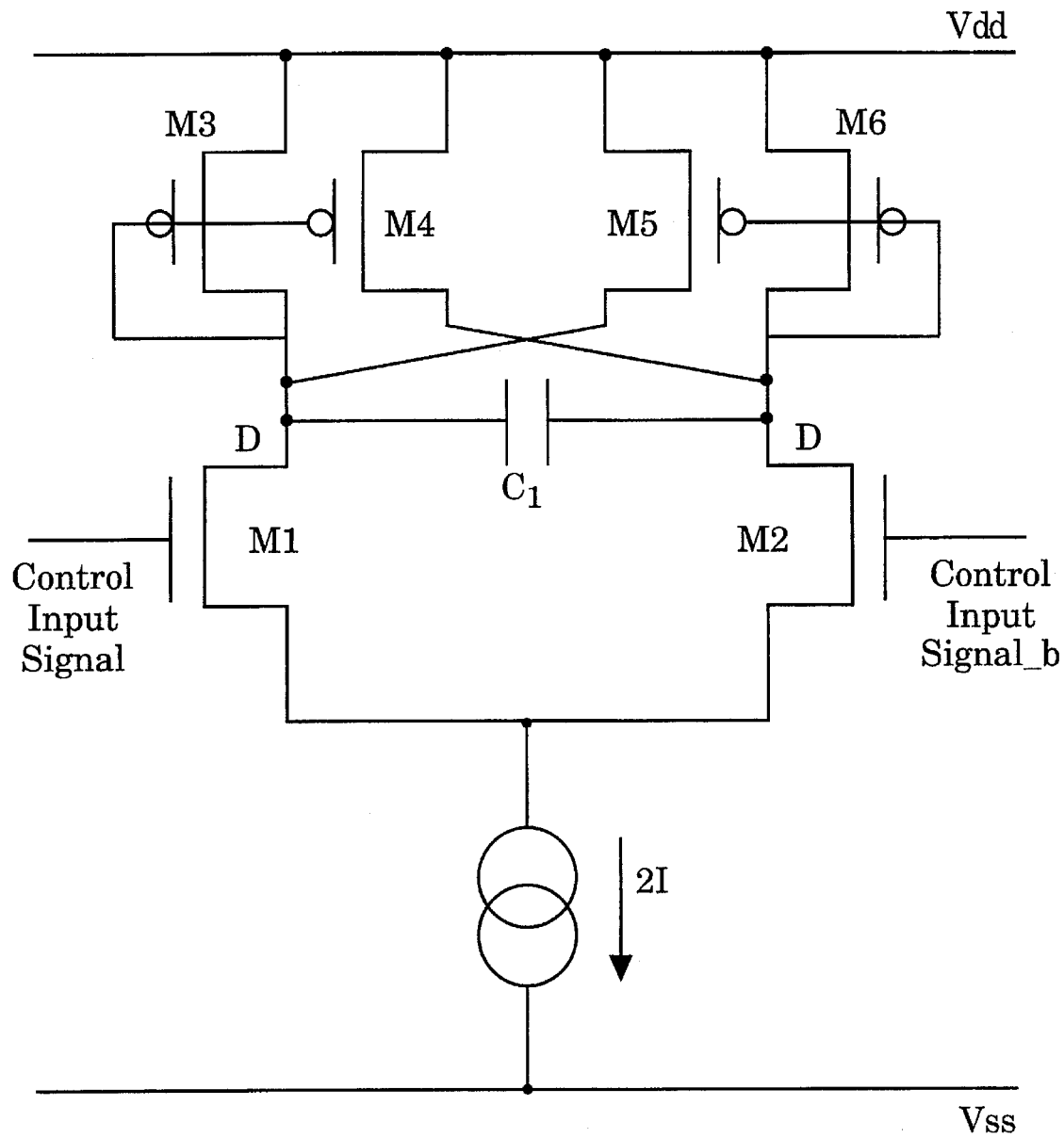
FIGS. 6a and 6b illustrate one embodiment of a charge pump utilized in one embodiment of the delay locked loop of the present invention.

Although any type of a charge pump may be used to supply current to the phase shifter, it is preferred that a differential charge pump be used. One embodiment of a differential charge pump is illustrated in FIG. 6a. In the embodiment shown in FIG. 6a, the load is formed of a quad of P-channel MOS devices. The transistors M3 and M6 are diode-connected, and are located in parallel with cross-connected transistors M4 and M5. For use in a charge pump circuit, transistors M3, M4, M5 and M6 are all made to be substantially of the same size. An integration capacitance $C_1$ is shown as a single device connected to the drains of the drive transistors M1 and M2.

The signals driving the gates of drive transistors M1 and M2 are assumed to be large enough in amplitude to switch substantially all of the current 2I of the current source into the integrating capacitance $C_1$.

The diode-connected devices, M3, M6, together present a positive differential resistance. The positive differential resistance by itself provides an undesirable leakage path for the integrating capacitance. To mitigate this leakage, the current through M3, M6 is canceled by the function of transistors M4, M5, which function can be viewed as that of a negative resistance. Thus, transistors M4, M5 cancel out the leakage of M3, M6 in the following manner.

Transistors M3 and M4 comprise a current mirror. Assuming ideal behavior, the two devices carry the same current. Because the drains of devices M3 and M4 are connected to opposite sides of the capacitance, the net contribution by this connection to the differential current is zero. By symmetry, the same reasoning applies to the current mirror formed by transistors M5, M6, so that the net differential resistance presented by transistors M3, M4, M5, M6 is ideally infinite, leaving only finite differential output resistance of the driving pair M1, M2, and the inherent capacitor leakage as differential loss mechanisms.

In practice, however, mismatches in the transistors cause departures from ideal behavior. Hence, it is desirable to choose the effective resistance of the diode-connected devices M3, M6 as high as possible such that any imperfect cancellation by respectively M4, M5, will have a proportionally smaller effect. The effect of finite differential output resistance of M1, M2, is usually negligible, because there is an inherent cascoding effect by M1, M2 on the current source. The charge pump switches all the current 2I into the integrating capacitance by the control input signals in either a positive or negative direction. For example, if M1 is turned on and M2 is turned off, transistor M1 acts as a cascoding device for the current source (which source is assumed to be realized with a transistor or collection of transistors), boosting the effective impedance.

This argument applies symmetrically to the case where M2 is on and M1 is off. Hence, the leakage caused by M1, M2 is generally negligible. Further advantage of the invention is that the common-mode output voltage of the charge pump is simply lower than the positive supply voltage by one source-to-gate voltage of a P-channel device.

Therefore, if the charge pump is ever disabled, for example, by shutting off the current source, recovery is relatively quick because common-mode levels cannot be moved far from their equilibrium active values.

Figure 6B:
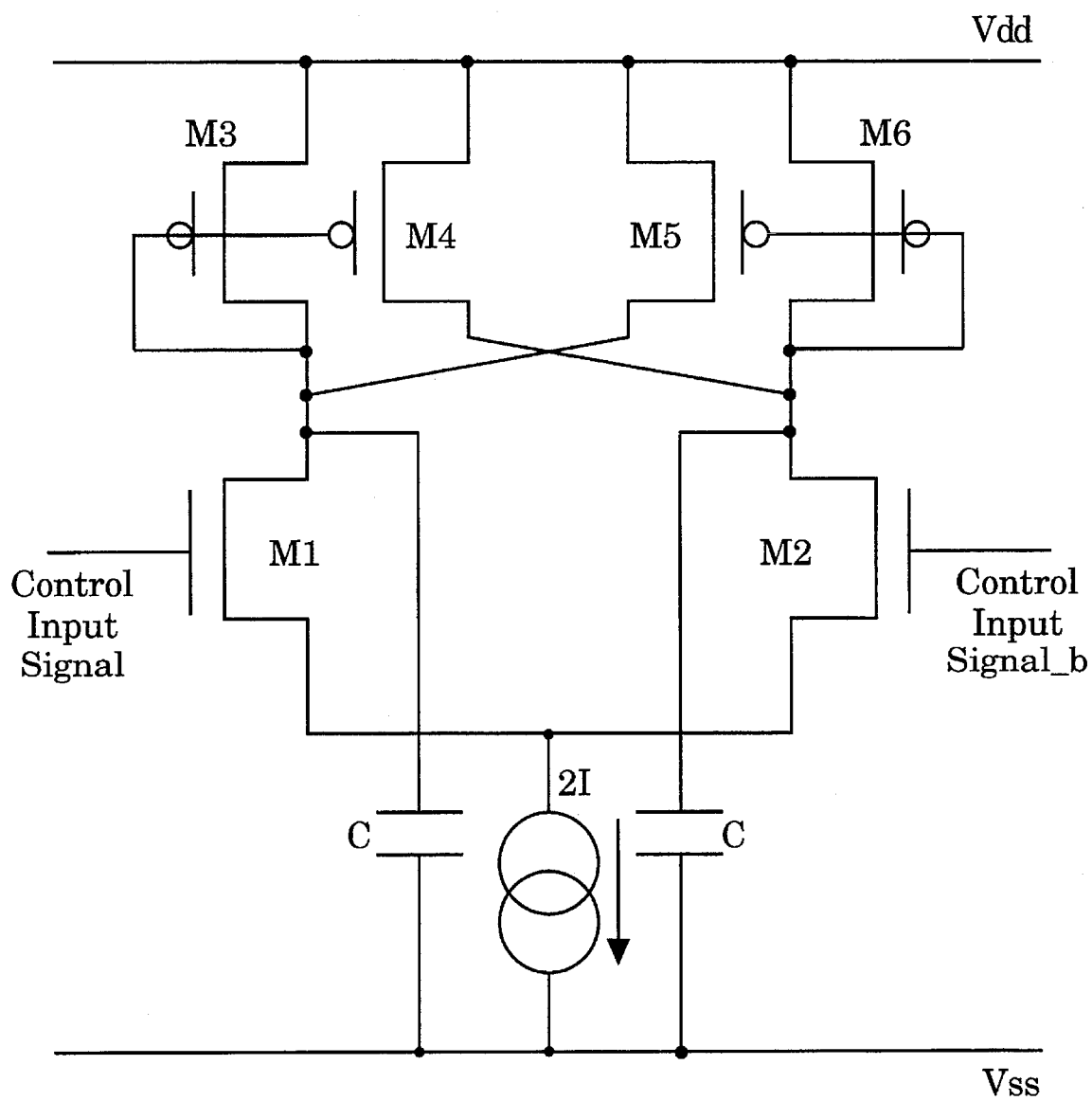

FIG. 6b shows a second embodiment of the charge pump circuit of the present invention. For this embodiment, an alternate connection of the integrating capacitance is employed. For some circuits, the most area-efficient capacitance is formed from the gate structure of a MOS transistor. Such capacitors require DC bias that is in excess of approximately one threshold voltage to maximize capacitance and to avoid excessive non-linearities. In this embodiment, the biasing criterion is satisfied by splitting the capacitor into two equal capacitors and coupling each capacitor to $V_{ss}$. By connecting each capacitor to $V_{ss}$, this embodiment provides filtering of power supply ($V_{dd}$) noise. Any noise on the positive power supply that couples through the p-channel load devices is bypassed by the capacitors, reducing greatly the amount of the noise passed on to any subsequent stage.

To provide unlimited phase shift using a charge pump with a finite control voltage range, the charge pump is preceded with a multiplexer 123 or similar means, as is well known in the art, to reverse the direction of the charge pump in alternate quadrants. The control signal to operate the multiplexer 123 is provided by the phase shifter 130. For example, when the DLL is out of lock, the phase detector 110 will output a constant signal, either a high or a low. In this instance, the charge pump could integrate up until it reaches its maximum voltage value. The phase shifter 130 would then sense this condition, switch quadrants in the phase shifter 130, and switch the multiplexer that precedes the charge pump to select a complimentary input. The charge pump would then reverse directions and integrate down until either phase lock is achieved or another quadrant boundary is reached. This enables the charge pump to continue to output a control voltage to provide infinite phase shift range, even though the charge pump itself has a finite output range.

Figure 7A:
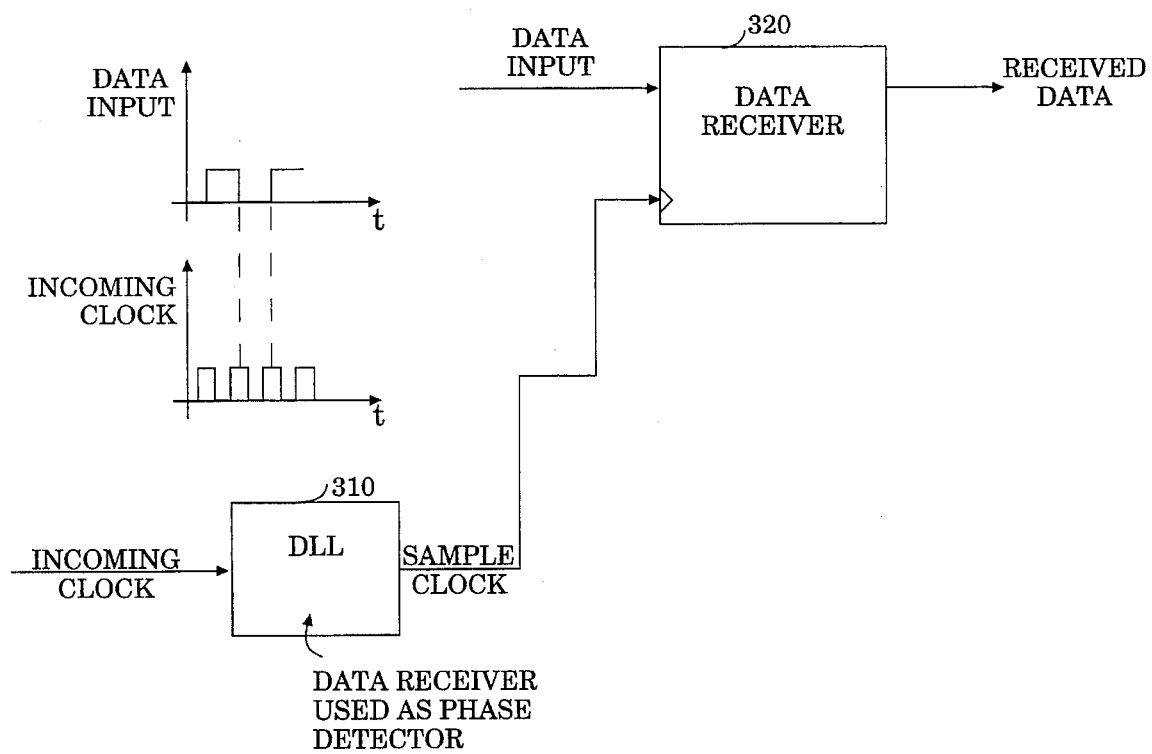
FIGS. 7a and 7b illustrate the delay locked loop of the present invention with a compensating phase detector respectively used in data receivers and data transmitters.

An alternate embodiment of the delay locked loop of the present invention is shown in FIG. 7a. In this embodiment, the DLL 310, for example the DLL circuit of FIG. 2, may be used to compensate for the set-up time of the data receiver 320 located in a remote section of a high speed digital system in which input data signal transitions are centered between the incoming clock signal edges. In the present illustration, a data receiver substantially similar to the data receiver 320 functions as the phase detector in the DLL 310. Because DLL 310 adjusts the signal using the phase shifter until the output of the phase detector is high 50% of the time, on average, by definition this condition corresponds to a sample clock signal that is timed to sample the incoming data at the optimal instants, independent of temperature, supply voltage and process variations. For example, if the setup time of data receiver 320 is 1 nanosecond, the sample clock signal will be delayed 1 nanosecond from the input clock signal. If the setup time value of 1 nanosecond varies with process, temperature and supply voltage variations, the DLL 310 automatically compensates as the data receiver/phase detector of the DLL 310 will likewise vary with process, temperature and supply voltage variations.

Figure 7B:
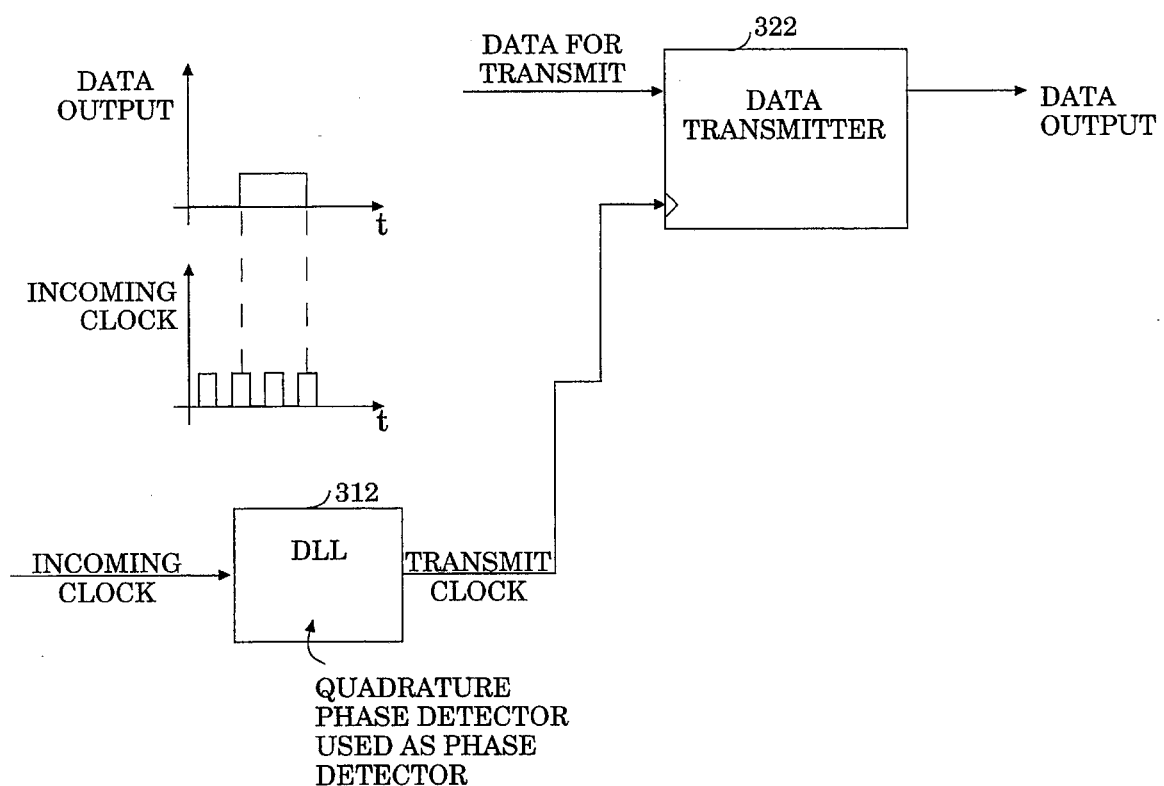

Another embodiment is shown in FIG. 7b. DLL 312 is utilized to generate the clock signals to transmit data in a digital system. More particularly, DLL 312 enables data signal output transitions to be precisely centered between the incoming clock signal edges. In this embodiment, a transmit clock signal, the phase of which is in quadrature with the incoming clock signal edges, is generated. Preferably the quadrature phase detector of FIG. 3 is used as the phase detector element in DLL 312. The transmit clock signal is input to the data transmitter 322 to control the timing of data output from the system.

Figure 8:
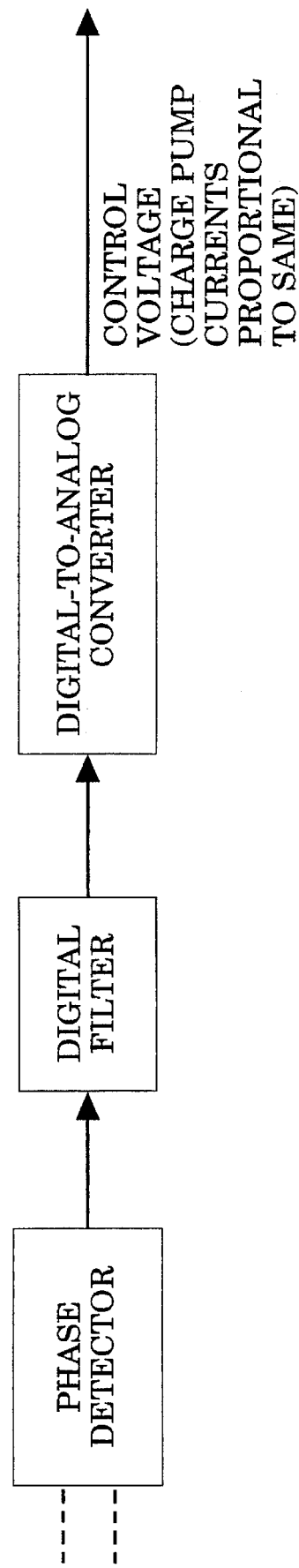
FIG. 8 is a block diagram illustration of an alternate embodiment of the delay locked loop of the present invention in which the control voltage to the differential charge pump is generated by a phase detector, digital filter and digital to analog converter which controls the differential charge pump using alternate acquisition criteria.

Referring to FIG. 8, in an alternate embodiment, the output of the phase detector may be input to a digital filter or other signal processing device, such as a processor or state machine, which examines the sequence of phase comparator outputs and enables boosted currents for acquisition when appropriate. For example, if the phase of the DLL output clock has been behind that of the input clock for a predetermined number of cycles, boosted acquisition is enabled. Therefore, for example, in a most general case, a binary search may be performed on a plurality of comparator outputs to determine a corresponding boosted current value to utilize.

The invention has been described in conjunction with the preferred embodiment. It is evident that numerous alternatives, modifications, variations and uses will be apparent to those skilled in the art in light of the foregoing description.

What is claimed is:

1. A circuit for generating an output signal in a predetermined timing relationship with an input signal, comprising:
   a duty cycle correcting amplifier coupled to receive the input signal, said amplifier correcting the duty cycle of the input signal to a predetermined duty cycle to produce a duty cycle corrected input signal;
   a phase detector coupled to receive the input signal and the output signal, said phase detector generating an output signal indicative of whether the output signal is ahead or behind the input signal in phase;
   a charge pump coupled to receive the output of the phase detector, said charge pump generating an output current; and
   a phase shifter coupled to receive the duty cycle corrected input signal, the output signal from the phase detector and the output current from the charge pump, said phase shifter performing a phase shift of the duty cycle corrected input signal to produce the output signal, said phase shifter driven by the output current of the charge pump, said direction of the phase shift indicated by the phase detector;
   wherein the phase of the output signal dithers around the phase of the input signal such that the output of the phase detector is a signal of a first state 50% of the time, on average.

2. A circuit for generating an output signal in a predetermined timing relationship with an input signal, comprising:
   a phase detector coupled to receive the input signal and the output signal, said phase detector generating an output signal indicative of whether the output signal is ahead or behind the input signal in phase;
   a charge pump coupled to receive the output of the phase detector, said charge pump generating an output current;
   a boost control signal coupled to the charge pump, said signal indicating when the circuit is in an acquisition mode wherein the circuit functions to acquire the desired timing relationship between the input signal and the output signal, said charge pump generating greater output current when said boost control signal is in a first state indicative that the circuit is in the acquisition mode;

a phase shifter coupled to receive the input signal, the output signal from the phase detector and the output current from the charge pump, said phase shifter performing a phase shift of the input signal to produce the output signal, said phase shifter driven by the output current of the charge pump, said direction of the phase shift indicated by the phase detector;

wherein the jitter in the circuit is minimized by increasing the current output by the charge pump when the circuit is in the acquisition mode and maintaining the current output at a lower level when the circuit is not in the acquisition mode.

3. A method for generating an output signal having a predetermined timing relationship with an input signal, said method comprising the steps of:

correcting the duty cycle of the input signal to a predetermined duty cycle to produce a duty cycle corrected input signal;

generating a phase output signal indicative of whether the output signal is ahead or behind the input signal in phase;

generating a current; and performing a phase shift of the duty cycle corrected input signal to produce the output signal, said step driven by the current, said direction of the phase shift indicated by the phase detector;

wherein the phase of the output signal dithers around the phase of the input signal such that the output of the phase detector is a signal of a first state 50% of the time, on average.

* * * * *